United States Patent [19]
Suzuki

[11] Patent Number: 6,111,311
[45] Date of Patent: Aug. 29, 2000

[54] SEMICONDUCTOR DEVICE AND METHOD OF FORMING THE SAME

[75] Inventor: Katsunobu Suzuki, Tokyo, Japan

[73] Assignee: NEC Corporation, Tokyo, Japan

[21] Appl. No.: 09/220,772

[22] Filed: Dec. 28, 1998

[30] Foreign Application Priority Data

Dec. 26, 1997 [JP] Japan ..................................... 9-358858

[51] Int. Cl.⁷ .......................... H01L 23/52; H01L 23/10; H01L 23/34
[52] U.S. Cl. ......................... 257/691; 257/706; 257/707; 257/780; 257/783; 257/784; 257/787; 257/793
[58] Field of Search ................................... 257/786, 691, 257/700, 706, 707, 780, 783, 784, 787, 793

[56] References Cited

U.S. PATENT DOCUMENTS

| 5,225,709 | 7/1993 | Nishiuma et al. | 257/700 |
| 5,420,460 | 5/1995 | Massingill | 257/693 |
| 5,490,324 | 2/1996 | Newman | 257/700 |
| 5,581,122 | 12/1996 | Chao et al. | 257/691 |
| 5,640,047 | 6/1997 | Nakashima | 257/738 |
| 5,672,909 | 9/1997 | Glenn et al. | 257/668 |
| 5,701,032 | 12/1997 | Fischer et al. | 257/692 |
| 5,721,454 | 2/1998 | Palmer | 257/700 |
| 5,798,571 | 8/1998 | Nakajima | 257/784 |

FOREIGN PATENT DOCUMENTS

| 2-186670 | 7/1990 | Japan | 257/691 |
| 7-283336 | 10/1995 | Japan . | |
| 8-153828 | 6/1996 | Japan . | |
| 9-307019 | 11/1997 | Japan . | |
| 10-41436 | 2/1998 | Japan . | |
| 11-145322 | 5/1999 | Japan . | |

Primary Examiner—Mahshid Saadat
Assistant Examiner—Jhihan B. Clark
Attorney, Agent, or Firm—Young & Thompson

[57] ABSTRACT

The present invention provides a semiconductor package comprising: an electrically conductive base plate having a first surface comprising first, second and third regions; a semiconductor chip provided on the first region of the electrically conductive base plate and the semiconductor chip having at least a first electrode and at least a second electrode; an insulation layer provided on the third region of the electrically conductive base plate; and an electrically conductive thin film pattern laminated on the insulation layer and the electrically conductive thin film pattern being electrically connected to the first electrode of the semiconductor chip, so that the electrically conductive thin film pattern and the first electrode have a first variable potential, wherein the second electrode is connected directly to the second region of the electrically conductive base plate so that the second electrode and the electrically conductive base plate has a second fixed potential which is different from the first variable potential.

23 Claims, 2 Drawing Sheets

SEMICONDUCTOR DEVICE AND METHOD OF FORMING THE SAME

BACKGROUND OF THE INVENTION

The present invention relates to a semiconductor device and a method of forming the same, and more particularly to a ball grid array semiconductor package.

FIG. 1 is a fragmentary cross sectional elevation view illustrative of a first conventional ball grid array semiconductor package having a single wiring layer which has high electrical performance. This first conventional ball grid array semiconductor package is disclosed in IEEE, 1996, Electronic Components and Technology Conference "TBGA Bond Process For Ground And Power Planes Connections."

The first conventional ball grid array semiconductor package has a metal heat spreader 33. The metal heat spreader 33 has a flat upper surface and a depressed portion. A mounting member 32 is provided on the depressed portion so that a semiconductor chip 31 is mounted on the mounting member 32 on the depressed portion. A power plane 34 is provided via an adhesive 37 on the flat upper surface of the metal heat spreader 33. A polyimide pattern 36 as an organic insulator is lamminated via the adhesive 37 on the power plane 34. A copper foil wiring pattern 35 is provided by a tape automated bonding to electrically connect electrodes of the semiconductor chip 3 into the metal heat spreader 33 and the power plane 34.

The above first conventional ball grid array semiconductor package utilizing the tape automated bonding technique has the following disadvantages. It is required to form tape automated bonding tapes for every product types of the ball grid array semiconductor packages separately. Further, it is required to carrying out an additional process for adhering the tape automated bonding tape onto the metal plate or adhering a metal plate onto the tape automated bonding semiconductor chip. Those requirements result in an increase in manufacturing costs.

FIG. 2 is a fragmentary cross sectional elevation view illustrative of a second conventional semiconductor package. This second conventional semiconductor package is disclosed in U.S. Pat. No. 5,153,385. The second conventional semiconductor package has a metal heat spreader 38 having a single flat upper surface. A first organic substrate 39 entirely coated with a ground potential plane 40 is adhered on the single flat upper surface of the metal heat spreader 38 except for a predetermined chip area on which a semiconductor chip 42 is provided. A second organic substrate 43 having signal wiring patterns 41 is also adhered on an upper surface of the ground potential plane 40 coating the first organic substrate 39. Ground electrodes of the semiconductor chip 42 are wire-bonded to the ground potential plane 40. Signal electrodes 45 of the semiconductor chip 42 are wire-bonded to the signal wiring patterns 41 on the second organic substrate 43. The signal wiring patterns 41 is electrically isolated by the second organic substrate 43 from the ground potential plane 40, so that the signal wiring patterns 41 have a predetermined impedance.

The above second conventional semiconductor package has the following disadvantages. Two organic substrates 39 and 43 are laminated over the metal heat spreader 38. This makes the semiconductor package expensive. Since the heat spreader 38 is connected through the ground potential plane 40 to the ground electrodes 44 of the semiconductor chip 42, thus it is difficult that the potential of the heat spreader 38 is grounded and also the potential of the semiconductor chip 42 is grounded. Since further the above second conventional semiconductor package has been formed by bombing the substrates, thus this structure may permit entry of moisture into the bonding surface between the substrates, whereby a reliability of the semiconductor memory device is deteriorated.

In the above circumstances, it had been required to develop a novel semiconductor package free from the above disadvantages.

SUMMARY OF THE INVENTION

Accordingly, it is an object of the present invention to provide a novel semiconductor package free from the above disadvantages.

It is a further object of the present invention to provide a novel semiconductor package suitable for securing a ground potential of a metal head spreader.

It is a still further object of the present invention to provide a novel semiconductor package which securely prohibits entry of moisture into the semiconductor package.

It is yet a further object of the present invention to provide a novel semiconductor package which may be formed without any additional processes.

The first present invention provides a wire-bonded semiconductor device having a ground potential wire-boning structure having at least a bonding wire which connects at least a first electrode fixed at a ground potential of a semiconductor chip to a ground bonding area of an electrically conductive base plate on which the semiconductor chip is mounted, so that the electrically conductive base plate is securely fixed at the ground potential.

The second present invention provides a semiconductor package comprising: an electrically conductive base plate having a first surface comprising first, second and third regions; a semiconductor chip provided on the first region of the electrically conductive base plate and the semiconductor chip having at least a first electrode and at least a second electrode; an insulation layer provided on the third region of the electrically conductive base plate; and an electrically conductive thin film pattern laminated on the insulation layer and the electrically conductive thin film pattern being electrically connected to the first electrode of the semiconductor chip, so that the electrically conductive thin film pattern and the first electrode have a first variable potential, wherein the second electrode is connected directly to the second region of the electrically conductive base plate so that the second electrode and the electrically conductive base plate has a second fixed potential which is different from the first variable potential.

The third present invention provides a semiconductor package comprising: a metal base plate having a first surface comprising first, second and third regions; a semiconductor chip provided on the first region of the metal base plate and the semiconductor chip having a plurality of signal electrodes and a plurality of ground electrodes; an organic insulation layer provided on the third region of the metal base plate; and a metal foil wiring pattern laminated on the organic insulation layer and the metal foil wiring pattern being wire-bonded to the signal electrodes of the semiconductor chip, wherein the ground electrodes are wire-bonded directly to the second region of the metal base plate so that the ground electrodes and the metal base plate remain to have a ground potential, and wherein the second region has a lower level than the third region, so that the second region has a lower level than the metal foil wiring pattern.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
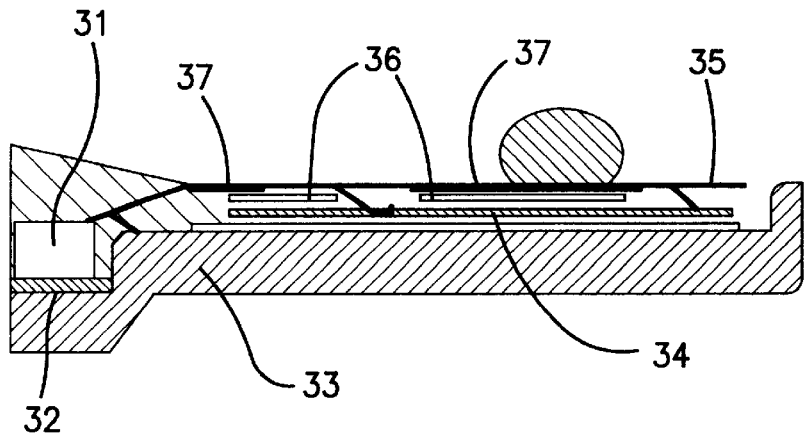
FIG. 1 is a fragmentary cross sectional elevation view illustrative of a first conventional ball grid array semiconductor package having a single wiring layer which has high electrical performances.
Figure 2:
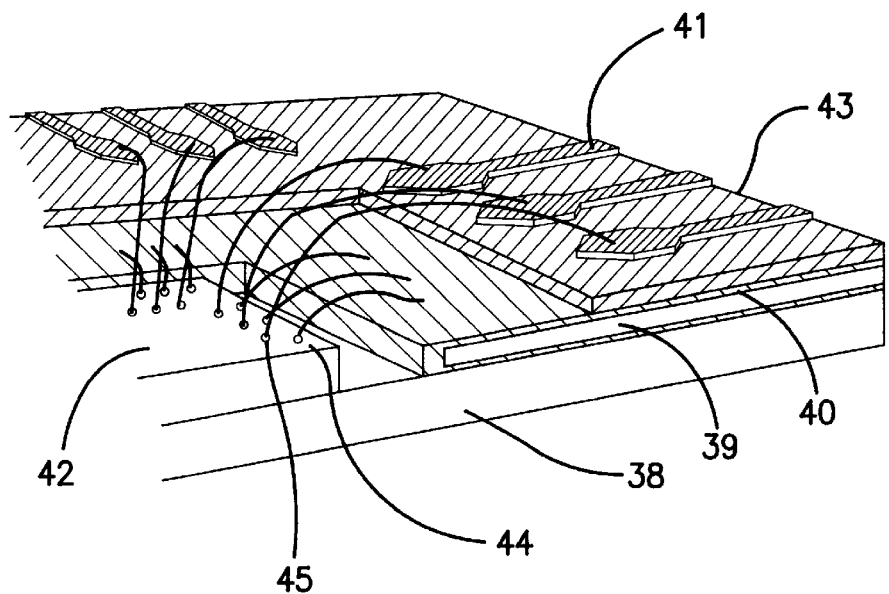
FIG. 2 is a fragmentary cross sectional elevation view illustrative of a second conventional semiconductor package.

The first present invention provides a wire-bonded semiconductor device having a ground potential wire-bonding structure having at least a bonding wire which connects at least a first electrode fixed at a ground potential of a semiconductor chip to a ground bonding area of an electrically conductive base plate on which the semiconductor chip is mounted, so that the electrically conductive base plate is securely fixed at the ground potential.

It is preferable that the electrically conductive base plate is electrically isolated by an insulator from a signal wiring pattern which is wire-bonded to at least a second electrode of the semiconductor chip, and the second electrode and the signal wiring pattern have a variable signal potential which is different from the ground potential.

It is further preferable that the insulator is provided on an outer region of the electrically conductive base plate and the outer region being separated by the ground bonding area from a center region on which the semiconductor chip is mounted, and the signal wiring pattern is laminated on the insulator so that the signal wiring pattern is electrically isolated by the insulator from the electrically conductive base plate.

It is also preferable that the ground bonding area of the electrically conductive base plate has a lower level than the signal wiring pattern.

It is further preferable that the ground bonding area of the electrically conductive base plate has a lower level than the outer region of the electrically conductive base plate.

It is furthermore preferable that the center region of the electrically conductive base plate has a lower level than the ground bonding area of the electrically conductive base plate.

It is moreover preferable that the ground bonding area of the electrically conductive base plate comprises a flat stage which is separated by a sloped portion from the center region.

It is also referable that the center region of the electrically conductive base plate has a higher level than the ground bonding area of the electrically conductive base plate.

It is further preferable that the center and outer regions of the electrically conductive base plate have substantially the same level as each other, so that the ground bonding area of the electrically conductive base plate is in a form of a groove having a flat bottom.

It is also preferable that the signal wiring pattern has a microstrip line structure.

The second present invention provides a semiconductor package comprising: an electrically conductive base plate having a first surface comprising first, second and third regions; a semiconductor chip provided on the first region of the electrically conductive base plate and the semiconductor chip having at least a first electrode and at least a second electrode; an insulation layer provided on the third region of the electrically conductive base plate; and an electrically conductive thin film pattern laminated on the insulation layer and the electrically conductive thin film pattern being electrically connected to the first electrode of the semiconductor chip, so that the electrically conductive thin film pattern and the first electrode have a first variable potential, wherein the second electrode is connected directly to the second region of the electrically conductive base plate so that the second electrode and the electrically conductive base plate has a second fixed potential which is different from the first variable potential.

It is preferable that the first electrode comprises a signal electrode which is wire-bonded to the electrically conductive thin film pattern and the second electrode comprises a ground electrode which is wire-bonded to the second region of the electrically conductive base plate so that the second electrode and the electrically conductive base plate remain in a ground potential, and wherein the second region of the electrically conductive base plate has a lower level than the electrically conductive thin film pattern.

It is further preferable that the second region of the electrically conductive base plate has a lower level than the third region of the electrically conductive base plate and the second region of the electrically conductive base plate is positioned between the first and third regions of the electrically conductive base plate.

It is further more preferable that the first region of the electrically conductive base plate has a lower level than the second region of the electrically conductive base plate.

It is moreover preferable that the second region of the electrically conductive base plate comprises a flat stage to which the ground electrode is wire-bonded, and a sloped portion between the flat stage and the first region.

It is also preferable that the first region of the electrically conductive base plate has a higher level than the second region of the electrically conductive base plate.

It is further preferable that the first and third regions of the electrically conductive base plate have substantially the same level as each other, so that the second region of the electrically conductive base plate is in a form of a groove having a flat bottom to which the ground electrode is wire-bonded.

It is also preferable that the electrically conductive thin film pattern has a microstrip line structure.

The third present invention provides a semiconductor package comprising: a metal base plate having a first surface comprising first, second and third regions; a semiconductor chip provided on the first region of the metal base plate and the semiconductor chip having a plurality of signal electrodes and a plurality of ground electrodes; an organic insulation layer provided on the third region of the metal base plate; and a metal foil wiring pattern laminated on the organic insulation layer and the metal foil wiring pattern being wire-bonded to the signal electrodes of the semiconductor chip, wherein the ground electrodes are wire-bonded directly to the second region of the metal base plate so that the ground electrodes and the metal base plate remain to have a ground potential, and wherein the second region has a lower level than the third region, so that the second region has a lower level than the metal foil wiring pattern.

It is preferable that the first region has a lower level than the second region.

It is further preferable that the second region comprises a flat stage to which the ground electrodes are wire-bonded, and a sloped portion between the flat stage and the first region.

It is also preferable that the first region has a higher level than the second region.

It is further preferable that the first and third regions have substantially the same level as each other, so that the second region is in a form of a groove having a flat bottom to which the ground electrodes are wire-bonded.

It is also preferable that the metal foil wiring pattern has a microstrip line structure.

Figure 3:
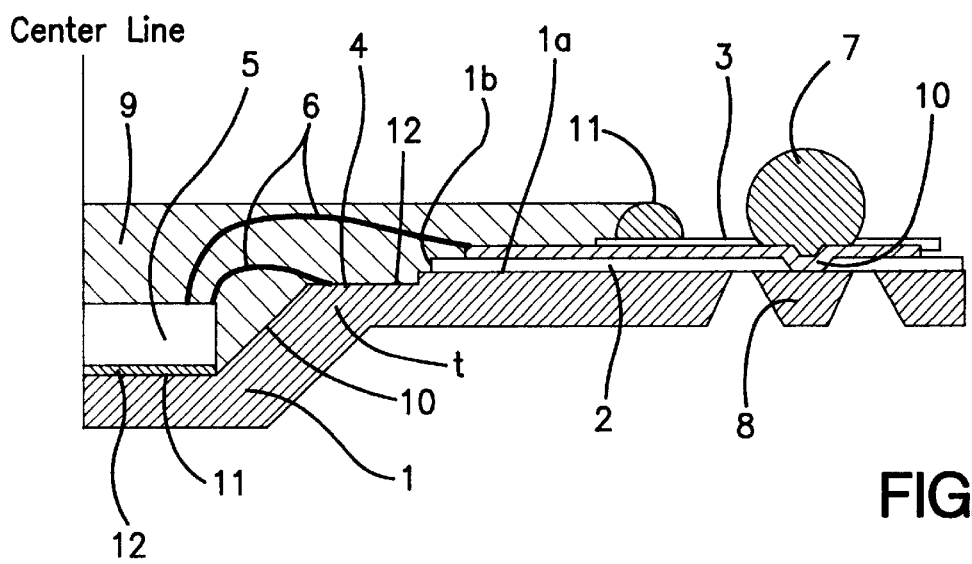
FIG. 3 is a fragmentary cross sectional elevation view illustrative of a first novel ball grid array semiconductor package having a wire-bonding structure in a first embodiment in accordance with the present invention.
Figure 4:
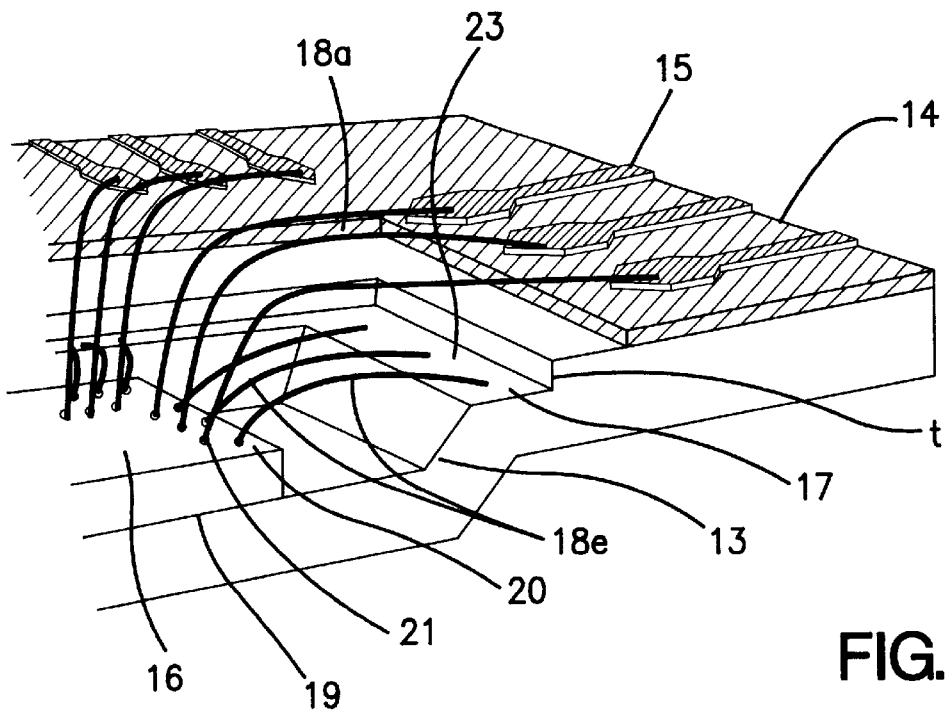
FIG. 4 is a fragmentary perspective view illustrative of the first novel ball grid array semiconductor package having a wire-bonding structure of FIG. 3.

PREFERRED EMBODIMENTS
First Embodiment:

A first embodiment according to the present invention will be described in detail with reference to FIG. 3 which is a fragmentary cross sectional elevation view illustrative of a first novel ball grid array semiconductor package having a wire-bonding structure in a first embodiment in accordance with the present invention. FIG. 4 is a fragmentary perspective view illustrative of the first novel ball grid array semiconductor package having a wire-bonding structure of FIG. 3.

The first novel ball grid array semiconductor package having a wire-bonding structure has a metal base plate 1 which has an upper surface comprising a center region 11, a sloped region 10, a ground bonding area 4 and an outer flat region 1a. The ground bonding area 4 is separated by the sloped region 10 from the center region 11. The outer flat region 1a is separated by the ground bonding area 4 from the sloped region 10. The ground bonding area 4 is bounded by a step to the outer flat region 1a, so that the ground bonding area 4 has a lower level by "t" than the outer flat region 1a. The center region 11 is connected through the sloped region 10 to the ground bonding area 4 so that the center region 11 has a lower level than the ground bonding area 4 by a difference in level of the sloped region 10.

A semiconductor chip 5 is adhered by a metal-admixed adhesive 12 on the center region 11 of the metal base plate 1. An organic insulating film 2 is adhered on the outer region 1a of the metal base plate 1. The organic insulating film 2 has through holes 10. The metal base plate 1 has check terminals 8 under the through holes 10. The organic insulating film 2 has an inside edge 1b which is positioned slightly outside the step bounding the outer region to the ground bonding area 4. Metal foil wiring patterns 3 are selectively provided on the organic insulating film 2, wherein the metal foil wiring patterns 3 also extend in the through holes 10 so that the metal foil wiring patterns 3 are made into contact with the check terminals 8 under the through holes 10. Solder balls 7 are provided on the metal foil wiring patterns 3 so that the solder balls 7 are positioned over the through holes 10. The semiconductor chip 5 has a plurality of ground electrodes which are electrically connected by bonding wires 6 to the ground bonding area 4 of the metal base plate 1 so that the ground electrodes and the metal base plate 1 except for the check terminals 8 are fixed at the ground potential. The semiconductor chip 5 also has a plurality of signal electrodes which are electrically connected by bonding wires 6 to the metal foil wiring patterns 3, so that the signal electrodes and the metal foil wiring patterns 3 have a variable signal potential. Since the metal base plate 1 is electrically isolated by the organic insulating film 2 from the metal foil wiring patterns 3, thus the metal base plate 1 is fixed at the ground potential free from the variable signal potential of the metal foil wiring patterns 3. A sealing resin 9 is provided to seal the semiconductor chip 5, the wire-bondings 6, and an inside half part of the laminations of the organic insulating film 2 and the metal foil wiring patterns 3, wherein an outside edge of the sealing resin 9 is terminated by a dam 11 extending at an intermediate position over the laminations of the organic insulating film 2 and the metal foil wiring patterns 3, so that the solder balls 7 are spaced apart from the outside edge of the sealing resin 9.

As illustrated in FIG. 4, the above metal base plate 1 may comprise a copper substrate 13 which has a thickness in the range of about 0.20–0.50 millimeters. The organic insulating film 2 may also comprise a polyimide film 14 which has a thickness in the range of about 25–60 micrometers. The metal foil wiring patterns 3 may also comprise copper foil wiring patterns 15 which has a thickness in the range of about 18–35 micrometers. The boundary between the ground bonding area 4 and the outer region of the copper substrate 13 may comprise a step 13 having a differences "t" in level of 50–1.00 micrometers. The ground bonding area 4 may comprise a ground bonding area 17 having a width of 0.2–0.5 millimeters. The semiconductor chip 5 may comprise a semiconductor chip 16 having a plurality of ground electrodes 20 and a plurality of signal electrodes 21, wherein the signal electrodes 21 are electrically connected through first gold bonding wires 18a to the copper foil wiring patterns 15, whilst the ground electrodes 20 are electrically connected through second gold bonding wires 18e to the ground bonding area 17 so that the copper substrate 13 is fixed at the ground potential. The copper foil wiring patterns 15 have a microstrip line structure which has a predetermined impedance of, for example, 50 ohms. The above step 23 permits multistage wire-bonding, whereby the device is responsible to the requirement for increasing the number of the multiple pins.

In accordance with the above novel device, the metal base plate is fixed at the ground potential so that the metal wiring patterns have a microstrip line structure, whereby electrical properties of the semiconductor package having a single wiring layer can be improved.

The above step of the metal base plate permits the multistage wire-bonding structure which allows reduction in the necessary height in looped bonding wires.

Further, the ground bonding area of the metal base plate may be formed by a press molding technique to increase a rigidity of the semiconductor package.

Furthermore, the above structure may prevent contact between adjacent bonding wires even the electrodes of the semiconductor chip are aligned at a fine pitch.

Second Embodiment

Figure 5:
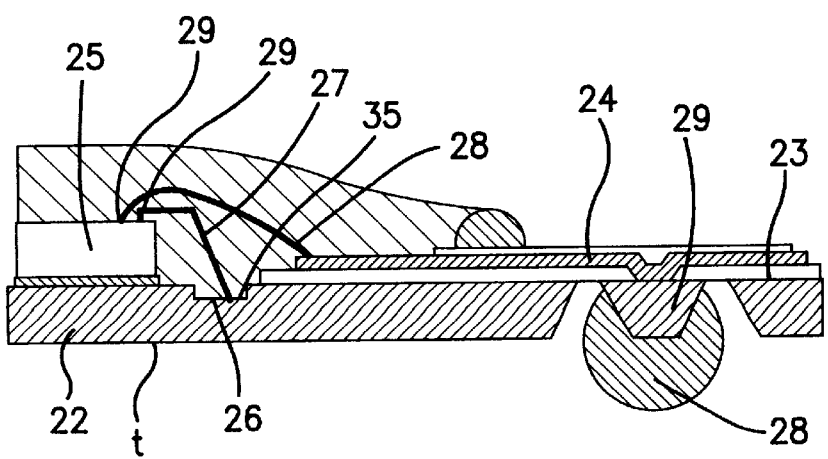
FIG. 5 is a fragmentary cross sectional elevation view illustrative of a second novel ball grid array semiconductor package having a wire-bonding structure in a second embodiment in accordance with the present invention.

A second embodiment according to the present invention will be described in detail with reference to FIG. 5 which is a fragmentary cross sectional elevation view illustrative of a second novel ball grid array semiconductor package having a wire-bonding structure in a second embodiment in accordance with the present invention.

The second novel ball grid array semiconductor package having a wire-bonding structure has a metal base plate 22 which has an upper surface comprising a center region, a ground bonding area 26 and an outer region. The center region and the outer region are separated by the ground bonding area 26 from each other. The ground bonding area 26 is bounded by steps to the outer flat region and to the center region, so that the ground bonding area 26 has a lower level by "t" than the outer flat region and the center region, wherein the outer flat region and the center region have the same level as each other, so that the ground bonding area 26 comprises a bottom of a groove between the outer flat region and the center region.

A semiconductor chip 25 is adhered by a metal-admixed adhesive on the center region of the metal base plate 22. An organic insulating film 23 is adhered on the outer region of the metal base plate 22. The organic insulating film 23 has through holes. The metal base plate 22 has land patterns 29 under the through holes. The organic insulating film 23 has an inside edge which is positioned slightly outside the step bounding the outer region to the ground bonding area 26. Metal foil wiring patterns 24 are selectively provided on the organic insulating film 23, wherein the metal foil wiring patterns 24 also extend in the through holes so that the metal foil wiring patterns 24 are made into contact with the land patterns 29 under the through holes. Solder balls 28 are provided on the land patterns 29 so that the solder balls 28 are positioned under the through holes. The semiconductor chip 25 has a plurality of ground electrodes 31 which are electrically connected by gold bonding wires 27 to the ground bonding area 26 of the metal base plate 22 so that the ground electrodes 31 and the metal base plate 22 except for the land patterns 29 are fixed at the ground potential. The semiconductor chip 25 also has a plurality of signal electrodes 30 which are electrically connected by gold bonding wires 28 to the metal foil wiring patterns 24, so that the signal electrodes 30 and the metal foil wiring patterns 24 have a variable signal potential. Since the metal base plate 22 is electrically isolated by the organic insulating film 23 from the metal foil wiring patterns 24, thus the metal base plate 22 is fixed at the ground potential free from the variable signal potential of the metal foil wiring patterns 24. A sealing resin is provided to seal the semiconductor chip 25, the gold bonding wires 27 and 28, and an inside half part of the laminations of the organic insulating film 23 and the metal foil wiring patterns 24, wherein an outside edge of the sealing resin is terminated by a dam extending at an intermediate position over the laminations of the organic insulating film 23 and the metal foil wiring patterns 24.

The above metal base plate 22 may comprise a copper substrate which has a thickness in the range of about 0.20–0.50 millimeters. The organic insulating film 23 may also comprise a polyimide film which has a thickness in the range of about 25–60 micrometers. The metal foil wiring patterns 24 may also comprise copper foil wiring patterns which have a thickness in the range of about 18–35 micrometers. The ground bonding area 26 comprising the bottom of the groove 35 is defined by steps having a differences "t" in level of 50–100 micrometers and a width of 0.2–0.5 millimeters. The semiconductor chip 25 has a plurality of ground electrodes 31 and a plurality of signal electrodes 30, wherein the signal electrodes 30 are electrically connected through first gold bonding wires 28 to the copper foil wiring patterns 24, whilst the ground electrodes 31 are electrically connected through second gold bonding wires 17 to the ground bonding area 26 so that the copper substrate 22 is fixed at the ground potential. The copper foil wiring patterns 24 have a microstrip line structure which has a predetermined impedance of, for example, 50 ohms. The above steps or the groove 35 permits multistage wire-bonding, whereby the device is responsible to the requirement for increasing the number of the multiple pins.

In accordance with the above novel device, the metal base plate is fixed at the ground potential so that the metal wiring patterns have a microstrip line structure, whereby electrical properties of the semiconductor package having a single wiring layer can be improved.

The above step of the metal base plate permits the multistage wire-bonding structure which allows reduction in the necessary height in looped bonding wires.

Further, the ground bonding area of the metal base plate may be formed by a press molding technique to increase a rigidity of the semiconductor package.

Furthermore, the above structure may prevent contact between adjacent bonding wires even the electrodes of the semiconductor chip are aligned at a fine pitch.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A wire-bonded semiconductor device having a ground potential wire-bonding structure having at least a bonding wire which connects at least a first electrode fixed at a ground potential of a semiconductor chip to a ground bonding area of an electrically conductive base plate on which said semiconductor chip is mounted, so that said electrically conductive base plate is securely fixed at said ground potential, wherein said electrically conductive base plate is electrically isolated by an insulator from a signal wiring pattern which is wire-bonded to at least a second electrode of said semiconductor chip, and said second electrode and said signal wiring pattern have a variable signal potential which is different from said ground potential.

2. The wire-bonded semiconductor device as claimed in claim 1, wherein said insulator is provided on an outer region of said electrically conductive base plate and said outer region being separated by said ground bonding area from a center region on which said semiconductor chip is mounted, and said signal wiring pattern is laminated on said insulator so that said signal wiring pattern is electrically isolated by said insulator from said electrically conductive base plate.

3. The wire-bonded semiconductor device as claimed in claim 1, wherein said ground bonding area of said electrically conductive base plate has a lower level than said signal wiring pattern.

4. The semiconductor package as claimed in claim 1, wherein said signal wiring pattern has a microstrip line structure.

5. The wire-bonded semiconductor device as claimed in claim 3, wherein said ground bonding area of said electrically conductive base plate has a lower level than said outer region of said electrically conductive base plate.

6. The wire-bonded semiconductor device as claimed in claim 5, wherein said center region of said electrically conductive base plate has a lower level than said ground bonding area of said electrically conductive base plate.

7. The wire-bonded semiconductor device as claimed in claim 5, wherein said center region of said electrically conductive base plate has a higher level than said ground bonding area of said electrically conductive base plate.

8. The wire-bonded semiconductor device as claimed in claim 6, wherein said ground bonding area of said electrically conductive base plate comprises a flat stage which is separated by a sloped portion from said enter region.

9. The wire-bonded semiconductor device as claimed in claim 7, wherein said center and outer regions of said electrically conductive base plate have substantially the same level as each other, so that said ground bonding area of said electrically conductive base plate is in a form of a groove having a flat bottom.

10. A semiconductor package comprising:
an electrically conductive base plate having a first surface comprising first, second and third regions;
a semiconductor chip provided on said first region of said electrically conductive base plate and said semiconductor chip having at least a first electrode and at least a second electrode;
an insulation layer provided on said third region of said electrically conductive base plate;
an electrically conductive thin film pattern laminated on said insulation layer and said electrically conductive thin film pattern being electrically connected to said first electrode of said semiconductor chip, so that said electrically conductive thin film pattern and said first electrode have a first variable potential,
wherein said second electrode is connected directly to said second region of said electrically conductive base plate so that said second electrode and said electrically conductive base plate has a second fixed potential which is different from said first variable potential.

11. The semiconductor package as claimed in claim 10, wherein said first electrode comprises a signal electrode which is wire-bonded to said electrically conductive thin film pattern and said second electrode comprises a ground electrode which is wire-bonded to said second region of said electrically conductive base plate so that said second electrode and said electrically conductive base plate remain in a ground potential, and wherein said second region of said electrically conductive base plate has a lower level than said electrically conductive thin film pattern.

12. The semiconductor package as claimed in claim 10, wherein said electrically conductive thin film pattern has a microstrip line structure.

13. The semiconductor package as claimed in claim 11, wherein said second region of said electrically conductive base plate has a lower level than said third region of said electrically conductive base plate and said second region of said electrically conductive base plate is positioned between said first and third regions of said electrically conductive base plate.

14. The semiconductor package as claimed in claim 13, wherein said first region of said electrically conductive base plate has a lower level than said second region of said electrically conductive base plate.

15. The semiconductor package as claimed in claim 13, wherein said first region of said electrically conductive base plate has a higher level than said second region of said electrically conductive base plate.

16. The semiconductor package as claimed in claim 14, wherein said second region of said electrically conductive base plate comprises a flat stage to which said ground electrode is wire-bonded, and a sloped portion between said flat stage and said first region.

17. The semiconductor package as claimed in claim 15, wherein said first and third regions of said electrically conductive base plate have substantially the same level as each other, so that said second region of said electrically conductive base plate is in a form of a groove having a flat bottom to which said ground electrode is wire-bonded.

18. A semiconductor package comprising:
a metal base plate having a first surface comprising first, second and third regions;
a semiconductor chip provided on said first region of said metal base plate and said semiconductor chip having a plurality of signal electrodes and a plurality of ground electrodes;
an organic insulation layer provided on said third region of said metal base plate;
a metal foil wiring pattern laminated on said organic insulation layer and said metal foil wiring pattern being wire-bonded to said signal electrodes of said semiconductor chip,
wherein said ground electrodes are wire-bonded directly to said second region of said metal base plate so that said ground electrodes and said metal base plate remain to have a ground potential, and
wherein said second region has a lower level than said third region, so that said second region has a lower level than said metal foil wiring pattern.

19. The semiconductor package as claimed in claim 18, wherein said first region has a lower level than said second region.

20. The semiconductor package as claimed in claim 18, wherein said metal foil wiring pattern has a microstrip line structure.

21. The semiconductor package as claimed in claim 19, wherein said second region comprises a flat stage to which said ground electrodes are wire-bonded, and a sloped portion between said flat stage and said first region.

22. The semiconductor package as claimed in claim 19, wherein said first region has a higher level than said second region.

23. The semiconductor package as claimed in claim 22, wherein said first and third regions have substantially the same level as each other, so that said second region is in a form of a groove having a flat bottom to which said ground electrodes are wire-bonded.

* * * * *